US012610778B2

(12) United States Patent
Nakaoka et al.

(10) Patent No.: US 12,610,778 B2
(45) Date of Patent: Apr. 21, 2026

(54) WAFER TRANSFER CARRIER AND SEMICONDUCTOR DEVICE MANUFACTURING METHOD

(71) Applicant: Kioxia Corporation, Tokyo (JP)

(72) Inventors: Satoshi Nakaoka, Yokkaichi Mie (JP); Hiroyasu Iimori, Nagoya Aichi (JP)

(73) Assignee: KIOXIA CORPORATION, Tokyo (JP)

( * ) Notice: Subject to any disclaimer, the term of this patent is extended or adjusted under 35 U.S.C. 154(b) by 329 days.

(21) Appl. No.: 18/457,821

(22) Filed: Aug. 29, 2023

(65) Prior Publication Data

US 2024/0087931 A1      Mar. 14, 2024

(30) Foreign Application Priority Data

Sep. 9, 2022      (JP) ................................. 2022-144067

(51) Int. Cl.
| | | |
|---|---|---|
| *H10P 72/10* | (2026.01) | |
| *H10P 50/64* | (2026.01) | |
| *H10P 70/00* | (2026.01) | |
| *H10P 72/30* | (2026.01) | |

(52) U.S. Cl.
CPC ........ *H10P 72/1922* (2026.01); *H10P 50/642* (2026.01); *H10P 70/20* (2026.01); *H10P 72/30* (2026.01)

(58) Field of Classification Search
CPC .... H10P 72/1922; H10P 50/642; H10P 70/20; H10P 72/30; H01L 21/677; H01L 21/67386
See application file for complete search history.

(56) References Cited

U.S. PATENT DOCUMENTS

| | | | |
|---|---|---|---|
| 5,824,119 A | 10/1998 | Takeuchi | |
| 2024/0087931 A1* | 3/2024 | Nakaoka | H01L 21/67386 |

FOREIGN PATENT DOCUMENTS

| | | | | |
|---|---|---|---|---|
| JP | H03228329 A | * | 10/1991 | |
| JP | H0569943 U | * | 9/1993 | |
| JP | H08-191056 A | | 7/1996 | |
| JP | H1174337 A | * | 3/1999 | ....... H01L 21/67366 |
| JP | 3998354 B2 | * | 10/2007 | ....... H01L 21/67376 |
| JP | 4449135 B2 | * | 4/2010 | |
| JP | 4522295 B2 | | 8/2010 | |
| JP | 4693268 B2 | * | 6/2011 | |
| JP | 2011255911 A | * | 12/2011 | |
| JP | 2011255912 A | * | 12/2011 | |
| JP | 2013-149689 A | | 8/2013 | |
| TW | 526531 B | * | 4/2003 | ....... H01L 21/67393 |
| WO | WO-2006038541 A1 | * | 4/2006 | ....... H01L 21/67369 |

OTHER PUBLICATIONS

Miraial Co. Ltd, "300mm FOUP"; URL: (JP) https://www.miraial.co.jp/product/300mm-foup/; (EN) https://www.miraial.co.jp/en/product/kt-3003/ © 2022 accessed on Jun. 23, 2023.

* cited by examiner

*Primary Examiner* — Jeffrie R Lund
(74) *Attorney, Agent, or Firm* — Foley & Lardner LLP

(57) ABSTRACT

A wafer transfer carrier includes a container and a lid portion. The container accommodates a wafer and a liquid, and is movable in a state where the wafer is in contact with the liquid. The lid portion is capable of sealing an inside of the container.

20 Claims, 16 Drawing Sheets

*FIG. 2*
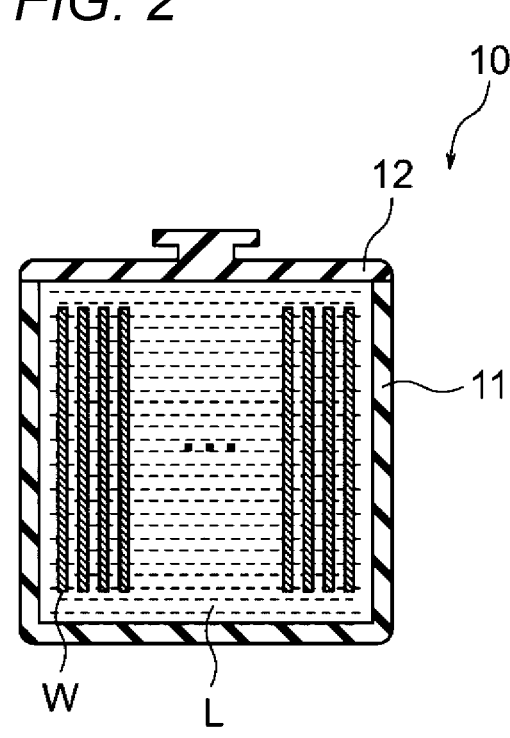
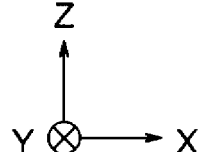
*FIG. 3*
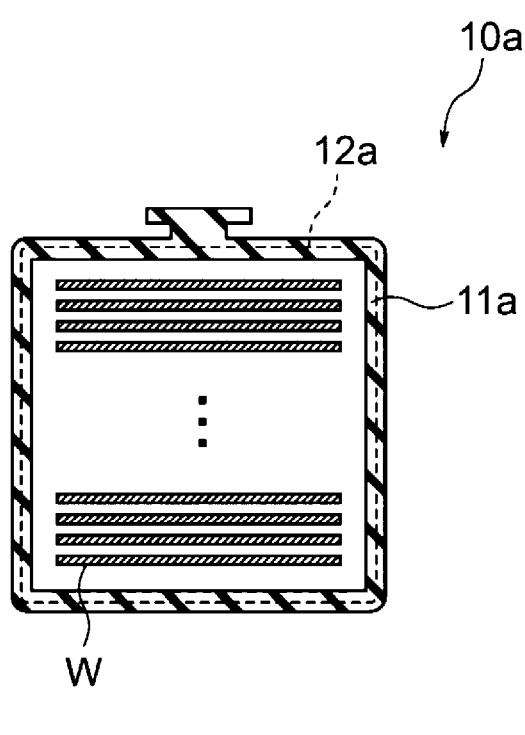
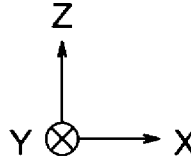

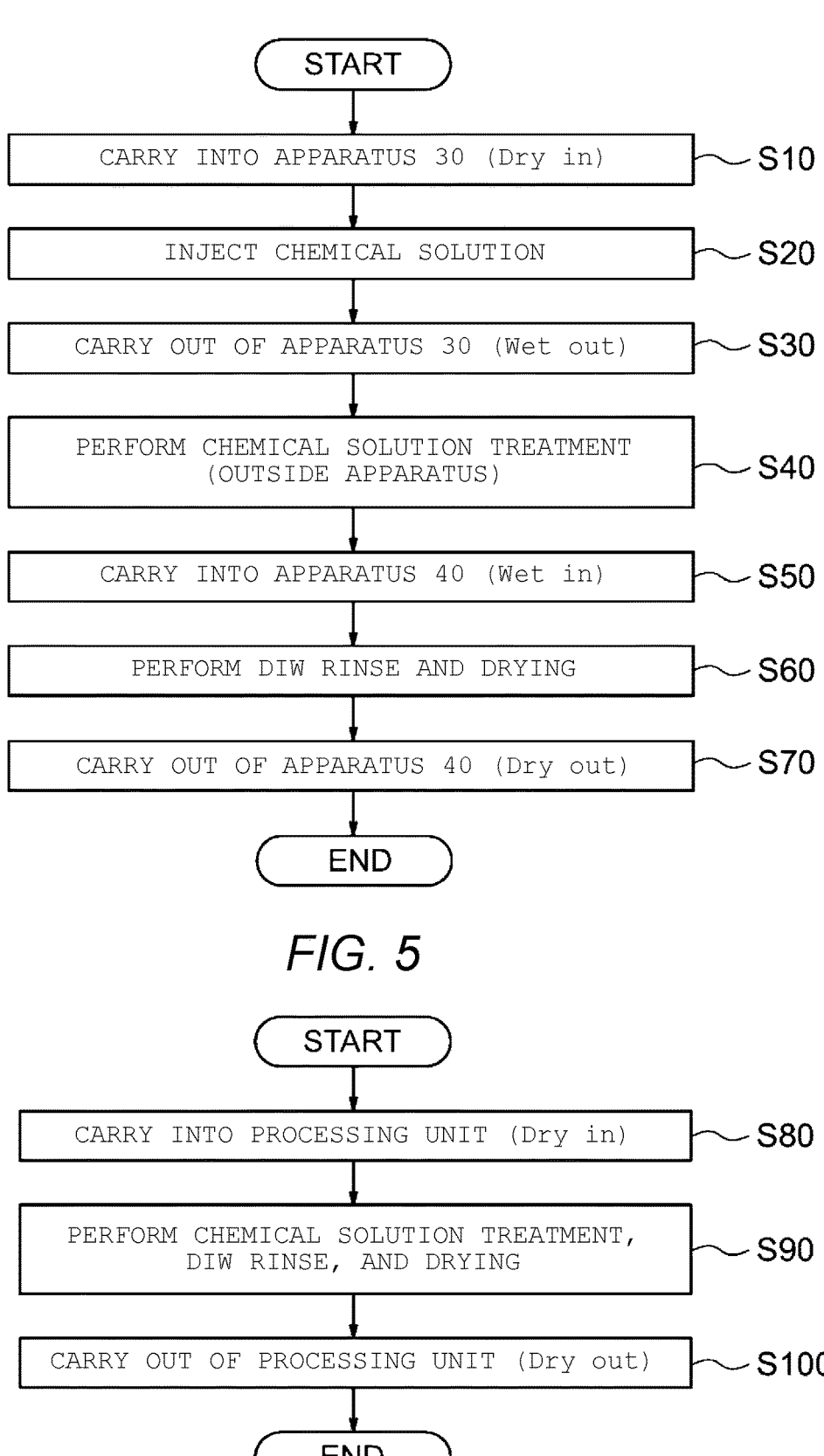

*FIG. 4*

START

CARRY INTO APPARATUS 30 (Dry in) — S10

INJECT CHEMICAL SOLUTION — S20

CARRY OUT OF APPARATUS 30 (Wet out) — S30

PERFORM CHEMICAL SOLUTION TREATMENT (OUTSIDE APPARATUS) — S40

CARRY INTO APPARATUS 40 (Wet in) — S50

PERFORM DIW RINSE AND DRYING — S60

CARRY OUT OF APPARATUS 40 (Dry out) — S70

END

*FIG. 5*

START

CARRY INTO PROCESSING UNIT (Dry in) — S80

PERFORM CHEMICAL SOLUTION TREATMENT, DIW RINSE, AND DRYING — S90

CARRY OUT OF PROCESSING UNIT (Dry out) — S100

END

ELECTRIC POWER SUPPLY

FIG. 12
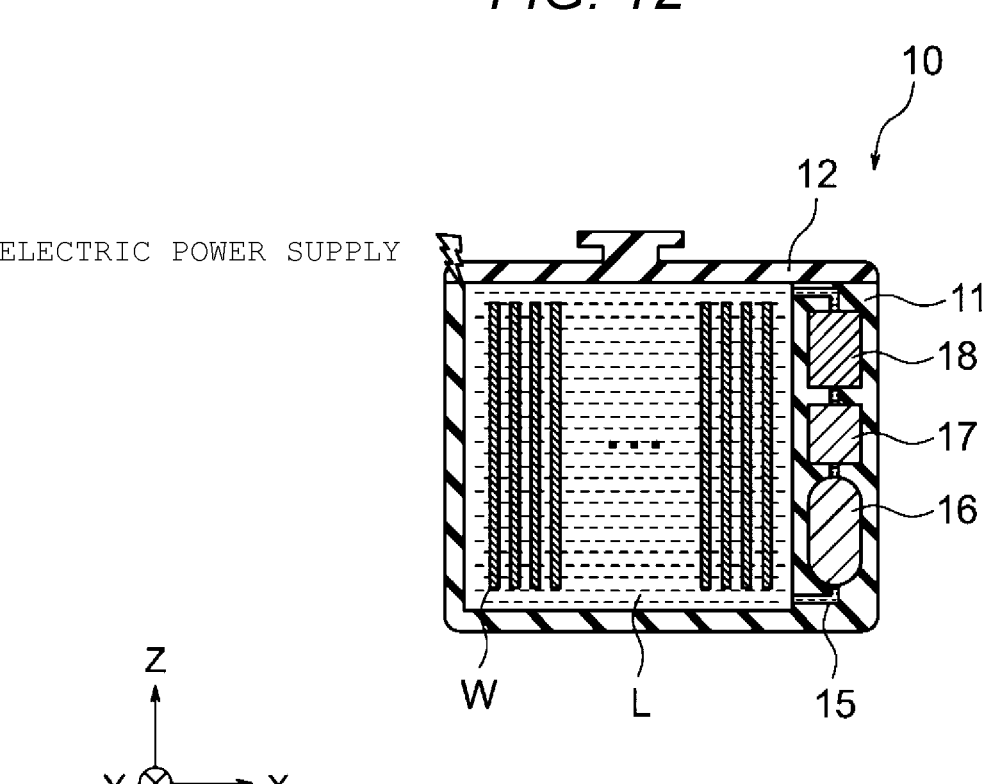
ELECTRIC POWER SUPPLY
FIG. 13
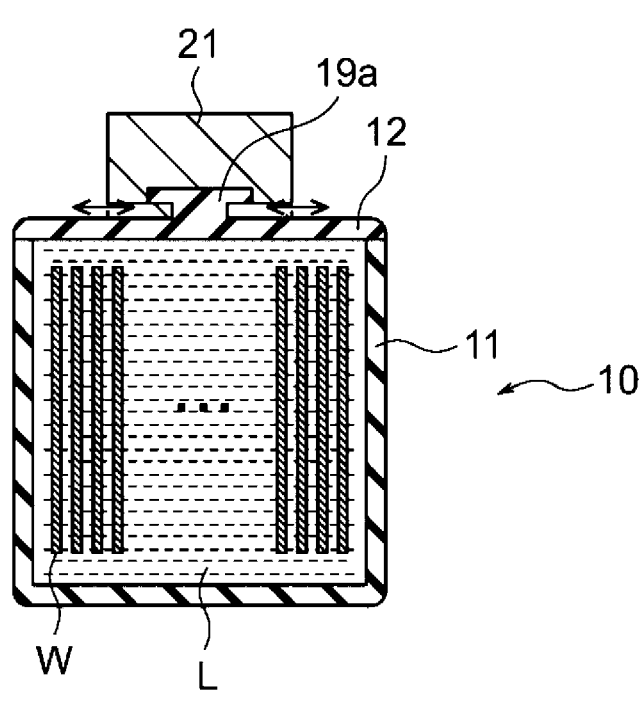
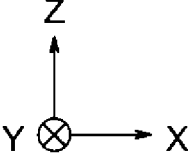

*FIG. 16*
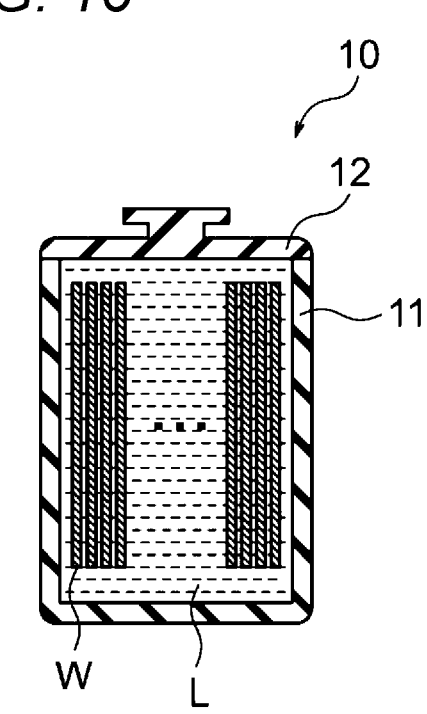
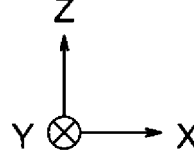

WAFER TRANSFER CARRIER AND SEMICONDUCTOR DEVICE MANUFACTURING METHOD

CROSS-REFERENCE TO RELATED APPLICATION(S)

This application is based upon and claims the benefit of priority from Japanese Patent Application No. 2022-144067, filed Sep. 9, 2022, the entire contents of which are incorporated herein by reference.

FIELD

Embodiments described herein relate generally to a wafer transfer carrier and a semiconductor device manufacturing method.

BACKGROUND

As for a wafer processing apparatus, wafers are usually carried out of the apparatus in a post-processing dry state.

DESCRIPTION OF THE DRAWINGS

FIG. 2 is a cross-sectional view illustrating an example of a configuration of a wafer transfer carrier according to the first embodiment.

FIG. 3 is a cross-sectional view illustrating an example of a configuration of a wafer transfer carrier according to the first embodiment.

FIG. 4 is a flowchart illustrating an example of a semiconductor device manufacturing method according to the first embodiment.

FIG. 5 is a flowchart illustrating an example of a semiconductor device manufacturing method according to a comparative example.

FIG. 12 is a cross-sectional view illustrating an example of a configuration of a wafer transfer carrier according to a fourth embodiment.

FIG. 13 is a cross-sectional view illustrating an example of a configuration of a wafer transfer carrier according to a fifth embodiment.

FIG. 16 is a cross-sectional view illustrating an example of a configuration of a wafer transfer carrier according to an eighth embodiment.

DETAILED DESCRIPTION

Figure 1:
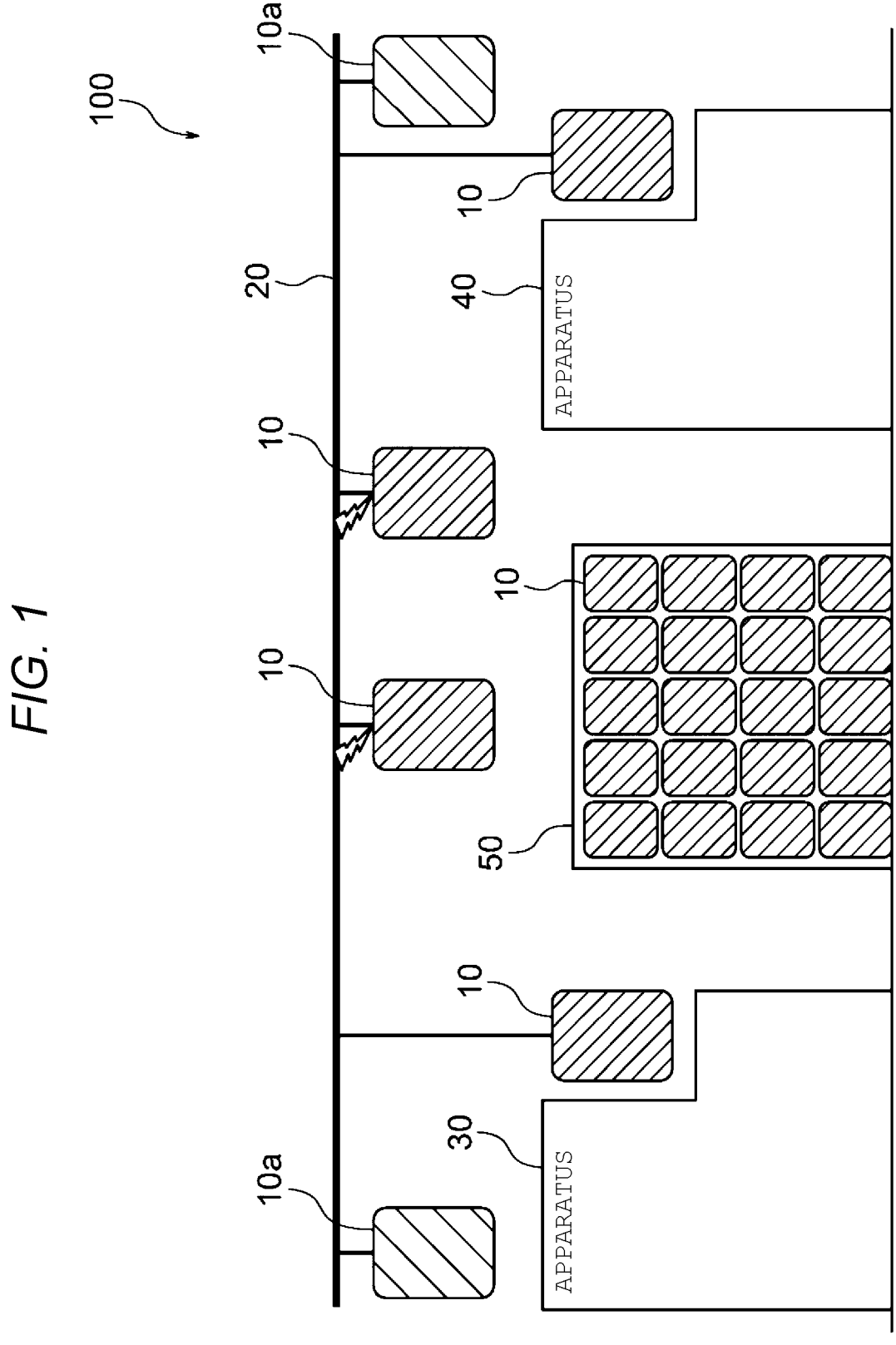
FIG. 1 is a diagram illustrating an example of a configuration of a semiconductor manufacturing system according to a first embodiment.

At least one embodiment provides a wafer transfer carrier capable of transferring a wafer in a state where the wafer is in contact with a liquid and a semiconductor device manufacturing method.

In general, according to at least one embodiment, a wafer transfer carrier includes a container and a lid portion. The container accommodates a wafer and a liquid, and is movable in a state where the wafer is in contact with the liquid. The lid portion is capable of sealing an inside of the container.

Hereinafter, embodiments according to the present disclosure will be described with reference to the drawings. The present embodiments do not limit the present disclosure. The drawings are schematic or conceptual and, for example, the ratio of each part is not necessarily the same as the actual one. In the specification and drawings, the same reference numerals are given to elements identical to those described in relation to the previous drawings, and detailed description thereof will be omitted as appropriate.

First Embodiment

FIG. 1 is a diagram illustrating an example of a configuration of a semiconductor manufacturing system 100 according to a first embodiment.

The semiconductor manufacturing system 100 includes wafer transfer carriers 10 and 10*a*, a transfer unit 20, apparatuses 30 and 40, and a placement portion 50.

The wafer transfer carrier 10 accommodates a wafer W and a liquid L and transfers the wafer W. Details of the wafer transfer carrier 10 will be described later with reference to FIG. 2.

The wafer transfer carrier 10*a* accommodates the wafer W and transfers the wafer W. The wafer transfer carrier 10*a* is, for example, a front opening unified pod (FOUP). Details of the wafer transfer carrier 10*a* will be described later with reference to FIG. 3.

The transfer unit 20 transfers the wafer transfer carriers 10 and 10*a*. The transfer unit 20 is, for example, an overhead hoist transport (OHT).

The apparatus 30 reloads the wafer W into the wafer transfer carrier 10 and supplies a chemical solution into the wafer transfer carrier 10.

The apparatus 40 performs deionized water (DIW) rinse and drying on the wafer W in the wafer transfer carrier 10. The apparatus 40 reloads the wafer W into the wafer transfer carrier 10*a*.

The placement portion 50 is provided between the apparatus 30 and the apparatus 40 on the path of the transfer unit 20. The placement portion 50 is, for example, a shelf where the wafer transfer carrier 10 is placed.

Next, the wafer transfer carrier 10 will be described.

FIG. 2 is a cross-sectional view illustrating an example of a configuration of the wafer transfer carrier 10 according to the first embodiment.

It is noted that, as illustrated in FIG. 2, X and Y directions are parallel to a bottom surface of the wafer transfer carrier 10 and are perpendicular to each other and a Z direction is perpendicular to the bottom surface of the wafer transfer carrier 10. In this specification, a +Z direction is an upward direction and a −Z direction is a downward direction. The −Z direction may or may not coincide with the direction of gravity.

The wafer transfer carrier 10 has a container 11 and a lid portion 12.

The container 11 accommodates the wafer W and the liquid L. The container 11 is movable in a state where the wafer W is in contact with the liquid L. In other words, the wafer W is immersed in the liquid L. The container 11 accommodates the wafer W such that a surface of the wafer W is placed vertically. As a result, the wafer W can be easily put in and taken out. In the example illustrated in FIG. 2, the wafer W is disposed such that the surface of the wafer W is substantially parallel to the YZ plane.

It is preferable that the container 11 has high strength in order to support the weight of the liquid L. A hard resin or a metal as an example is used for the container 11.

The lid portion 12 is capable of sealing the inside of the container 11. The lid portion 12 is provided on the container 11 so that the container 11 accommodates the liquid L.

FIG. 3 is a cross-sectional view illustrating an example of a configuration of the wafer transfer carrier 10*a* according to the first embodiment.

The wafer transfer carrier 10*a* has a container 11*a* and a lid portion 12*a*.

The container 11*a* accommodates the wafer W. The container 11*a* accommodates the wafer W such that the surface of the wafer W is placed horizontally. In the example illustrated in FIG. 3, the wafer W is disposed such that the surface of the wafer W is substantially parallel to the XY plane.

The lid portion 12*a* is capable of sealing the inside of the container 11*a*. The lid portion 12*a* is provided on the side portion of the container 11*a*. The wafer transfer carrier 10*a* is filled with gas.

Next, the operation of the semiconductor manufacturing system 100 will be described.

FIG. 4 is a flowchart illustrating an example of a semiconductor device manufacturing method according to the first embodiment. In the first embodiment illustrated in FIG. 4, the liquid L is, for example, the chemical solution for wet etching.

First, the transfer unit 20 carries the wafer transfer carrier 10*a* accommodating the wafer W into the apparatus 30 (S10). The wafer W is transferred by the wafer transfer carrier 10*a* that does not contain the liquid L therein. Therefore, the wafer W is carried into the apparatus 30 in a dry state.

Next, the apparatus 30 reloads the wafer W into the wafer transfer carrier 10 and injects the chemical solution into the container 11 (S20).

Next, the transfer unit 20 carries the wafer transfer carrier 10 out of the apparatus 30 (S30). The wafer W is transferred by the wafer transfer carrier 10 that is filled with the chemical solution. Therefore, the wafer W is carried out of the apparatus 30 in a wet state. In other words, the transfer unit 20 moves the container 11 from the apparatus 30 in a state where the wafer W in the container 11 is in contact with the chemical solution.

Next, chemical solution treatment is performed outside the apparatus 30 (S40). The processing of the wafer W is performed while, for example, the wafer transfer carrier 10 is transferred.

It is noted that the transfer unit 20 may place the wafer transfer carrier 10 in the placement portion 50 when a processing time is long. In this case, the wafer transfer carrier 10 is placed in the placement portion 50 according to the processing time.

Next, the transfer unit 20 carries the wafer transfer carrier 10 into the apparatus 40 (S50). The wafer W is transferred by the wafer transfer carrier 10 that is filled with the chemical solution. Therefore, the wafer W is carried into the apparatus 40 in a wet state. In other words, the transfer unit 20 moves the container 11 to the apparatus 40 supplying a rinse liquid (for example, DIW).

Next, the apparatus 40 performs DIW rinse and drying (S60).

Subsequently, the apparatus 40 reloads the wafer W into the wafer transfer carrier 10*a*.

Next, the transfer unit 20 carries the wafer transfer carrier 10*a* out of the apparatus 40 (S70). The wafer W is transferred by the wafer transfer carrier 10*a* that does not contain the liquid L therein. Therefore, the wafer W is carried out of the apparatus 40 in a dry state.

Subsequently, further processing (not illustrated) is performed on the wafer W.

As described above, according to the first embodiment, the container 11 is movable in a state where the wafer W is in contact with the liquid L. As a result, the wafer W can be transferred in a state where the wafer W is immersed in the liquid L. When the liquid L is the chemical solution, the wafer W can be processed outside a chemical solution treatment apparatus.

In addition, the container 11 and the lid portion 12 have fluorine-coated inner surfaces. As a result, the chemical resistance or the like of the wafer transfer carrier 10 can be improved even when the liquid L is the chemical solution. A fluorine resin such as poly tetra fluoro ethylene (PTFE) and perfluoroalkoxy (PFA) is used for the fluorine coating.

Comparative Example

FIG. 5 is a flowchart illustrating an example of a semiconductor device manufacturing method according to a comparative example. The wafer transfer carrier 10 is not used in the comparative example.

In the comparative example, one processing unit including, for example, a chemical solution treatment apparatus and a drying apparatus processes the wafer W.

First, the transfer unit 20 carries the wafer transfer carrier 10a accommodating the wafer W into the processing unit (S80). The wafer W is transferred by the wafer transfer carrier 10a that does not contain the liquid L therein. Therefore, the wafer W is carried into the processing unit in a dry state.

Next, the processing unit sequentially performs chemical solution treatment, DIW rinse, and drying (S90).

Next, the transfer unit 20 carries the wafer transfer carrier 10a out of the processing unit (S100). The wafer W is transferred by the wafer transfer carrier 10a that does not contain the liquid L therein. Therefore, the wafer W is carried out of the processing unit in a dry state.

In the comparative example, for example, when the chemical solution treatment is time-consuming, the non-operating time of the drying apparatus may also increase. In other words, the throughput of the entire processing unit may be reduced by an apparatus (process) that performs throughput rate control, which is a part in the processing unit. In addition, there may be a decline in the operating rate of an apparatus that does not perform the throughput rate control, such as the drying apparatus.

In addition, the processing unit in the comparative example is one set, and thus it is difficult to, for example, partially replace the chemical solution treatment apparatus or the drying apparatus with a new apparatus. Therefore, in replacing, for example, the drying apparatus with a new apparatus, the entire processing unit needs to be replaced with a new processing unit.

On the other hand, in the first embodiment, the apparatus 30 is capable of continuing to supply the chemical solution even when the chemical solution treatment is time-consuming, and thus a decline in throughput can be prevented. As a result, the operating rates of the apparatuses 30 and 40 can be improved and, in the chemical solution treatment, it is possible to easily select a long-processing time chemical solution such as a low-etching rate chemical solution.

In addition, in the first embodiment, for example, each of the apparatuses 30 and 40 can be replaced individually. As a result, for example, apparatuses from different manufacturers can be used as the apparatus 30 and the apparatus 40. As a result, it is possible to increase chemical solution treatment-drying combination options. In addition, batch-type chemical solution treatment may be combined with a sheet-type drying technique or sheet-type chemical solution treatment may be combined with a batch-type drying technique. As a result, the degree of freedom of selection can be improved.

It is noted that, in the first embodiment, the apparatus 30 is a dedicated apparatus for chemical solution injection and the apparatus 40 is a dedicated apparatus for rinse and drying. However, the apparatuses 30 and 40 are not limited thereto. The apparatuses 30 and 40 may be provided in an apparatus of one processing unit or may be apparatuses of separate processing units. In either case, chemical solution treatment is performed outside the apparatus.

First Modification of First Embodiment

Figure 6:
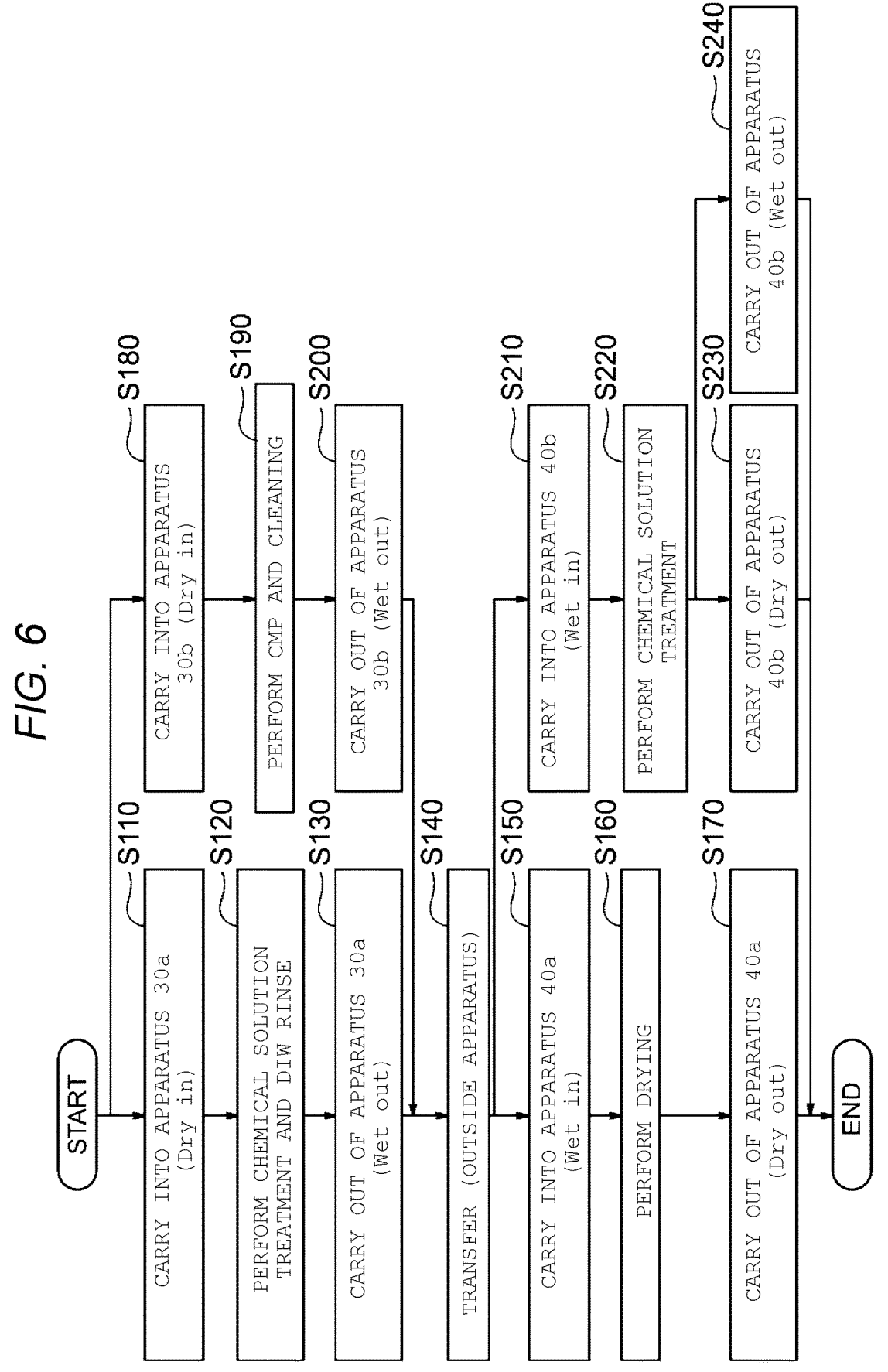
FIG. 6 is a flowchart illustrating an example of a semiconductor device manufacturing method according to a first modification of the first embodiment.

FIG. 6 is a flowchart illustrating an example of a semiconductor device manufacturing method according to a first modification of the first embodiment. In the first modification of the first embodiment illustrated in FIG. 6, the liquid L is, for example, pure water (DIW). The first modification of the first embodiment differs from the first embodiment in that the wafer transfer carrier 10 is carried out of the apparatus in a state where the pure water is in the wafer transfer carrier 10.

In steps S110 to S130 illustrated in FIG. 6, an apparatus 30a is provided instead of the apparatus 30. In steps S180 to S200 illustrated in FIG. 6, an apparatus 30b is provided instead of the apparatus 30.

The apparatus 30a performs chemical solution treatment and DIW rinse on the wafer W. The apparatus 30a places the wafer W in the wafer transfer carrier 10 and supplies the pure water into the wafer transfer carrier 10 after the chemical solution treatment.

The apparatus 30b is an apparatus that performs at least cleaning of the wafer W. The apparatus 30b is, for example, a chemical mechanical polishing (CMP) apparatus. After CMP, the apparatus 30b places the wafer W in the wafer transfer carrier 10 and supplies the pure water into the wafer transfer carrier 10.

In steps S150 to S170 illustrated in FIG. 6, an apparatus 40a is provided instead of the apparatus 40. In steps S210 to S240 illustrated in FIG. 6, an apparatus 40b is provided instead of the apparatus 40.

The apparatus 40a dries the wafer W. The apparatus 40a reloads the wafer W into the wafer transfer carrier 10a.

The apparatus 40b performs chemical solution treatment on the wafer W. After the chemical solution treatment, the apparatus 40b dries the inside of the wafer transfer carrier 10 and reloads the wafer W into the wafer transfer carrier 10a.

First, the transfer unit 20 carries the wafer transfer carrier 10a accommodating the wafer W into the apparatus 30a (S110). The wafer W is transferred by the wafer transfer carrier 10a that does not contain the liquid L therein. Therefore, the wafer W is carried into the apparatus 30a in a dry state.

Next, the apparatus 30a performs chemical solution treatment and DIW rinse (S120).

Subsequently, the apparatus 30a places the wafer W in the wafer transfer carrier 10 and supplies the pure water into the wafer transfer carrier 10.

Next, the transfer unit 20 carries the wafer transfer carrier 10 out of the apparatus 30a (S130). The wafer W is transferred by the wafer transfer carrier 10 that is filled with the pure water. Therefore, the wafer W is carried out of the apparatus 30a in a wet state. In other words, the transfer unit 20 moves the container 11 from the apparatus 30a in a state where the wafer W in the container 11 is in contact with the pure water.

Next, the transfer unit 20 performs transfer outside the apparatus 30a (S140). The state where the wafer W is in contact with the pure water is maintained until the next process.

Next, the transfer unit 20 carries the wafer transfer carrier 10 into the apparatus 40a (S150). The wafer W is transferred by the wafer transfer carrier 10 that is filled with the pure water. Therefore, the wafer W is carried into the apparatus 40a in a wet state.

Next, the apparatus 40a performs drying (S160).

Subsequently, the apparatus 40a reloads the wafer W into the wafer transfer carrier 10a.

Next, the transfer unit 20 carries the wafer transfer carrier 10a out of the apparatus 40a (S170). The wafer W is transferred by the wafer transfer carrier 10a that does not contain the liquid L therein. Therefore, the wafer W is carried out of the apparatus 40a in a dry state.

Next, a case where steps S180 to S200 are performed instead of steps S110 to S130 will be described.

First, the transfer unit 20 carries the wafer transfer carrier 10a into the apparatus 30b (S180). The wafer W is transferred by the wafer transfer carrier 10a that does not contain the liquid L therein. Therefore, the wafer W is carried into the apparatus 30b in a dry state.

Next, the apparatus 30b performs CMP and cleaning (S190).

Subsequently, the apparatus 30b places the wafer W in the wafer transfer carrier 10 and supplies the pure water into the wafer transfer carrier 10.

Next, the transfer unit 20 carries the wafer transfer carrier 10a accommodating the wafer W out of the apparatus 30b (S200). The wafer W is transferred by the wafer transfer carrier 10 that is filled with the pure water. Therefore, the wafer W is carried out of the apparatus 30b in a wet state.

Next, the transfer unit 20 performs transfer outside the apparatus 30b (S140).

Next, a case where steps S210 to S230 are performed instead of steps S150 to S170 will be described.

After the transfer by the transfer unit 20 in step S140, the transfer unit 20 carries the wafer transfer carrier 10 into the apparatus 40b (S210). The wafer W is transferred by the wafer transfer carrier 10 that is filled with the pure water. Therefore, the wafer W is carried into the apparatus 40b in a wet state.

Next, the apparatus 40b performs chemical solution treatment (S220).

Subsequently, the apparatus 40b performs DIW rinse and drying on the wafer W and reloads the wafer W into the wafer transfer carrier 10a.

Next, the transfer unit 20 carries the wafer transfer carrier 10a out of the apparatus 40b (S230). The wafer W is transferred by the wafer transfer carrier 10a that does not contain the liquid L therein. Therefore, the wafer W is carried out of the apparatus 40b in a dry state.

Next, a case where step S240 is performed instead of step S230 will be described.

After the chemical solution treatment by the apparatus 40b in step S220, the apparatus 40b performs DIW rinse. Subsequently, the apparatus 40b places the wafer W in the wafer transfer carrier 10 and supplies the pure water into the wafer transfer carrier 10.

Next, the transfer unit 20 carries the wafer transfer carrier 10 out of the apparatus 40b (S240). The wafer W is transferred by the wafer transfer carrier 10 that is filled with the pure water. Therefore, the wafer W is carried out of the apparatus 40b in a wet state.

In the first modification of the first embodiment, in step S140 illustrated in FIG. 6, the wafer transfer carrier 10 (container 11) is movable in a state where the wafer W is in contact with the pure water. As a result, the wafer W can be transferred without being in contact with air. Contact between the wafer W and the air results in the reaction between the silicon surface of the wafer W, such as silicon oxide formation. As a result, the subsequent processes may be affected and defects may arise. In addition, there is no need to worry about the time until the next process in the presence of an air-wafer W reaction process.

In addition, the drying apparatus (apparatus 40a) can be shared by a plurality of units such as the wet etching apparatus (apparatus 30a) and the CMP apparatus (apparatus 30b), and overall optimization is possible.

In addition, drying may be omitted when a process in which the liquid L is used is continuous. In the example illustrated in FIG. 6, drying is not performed after the chemical solution treatment in step S120 or the CMP and cleaning in step S190 when chemical solution treatment is performed in step S220.

The wafer transfer carrier 10 may be transferred out of the apparatus with pure water in the wafer transfer carrier 10 as in the first modification of the first embodiment. The wafer transfer carrier 10 and the semiconductor device manufacturing method according to the first modification of the first embodiment can be identical in effect to the first embodiment.

Second Modification of First Embodiment

Figure 7:
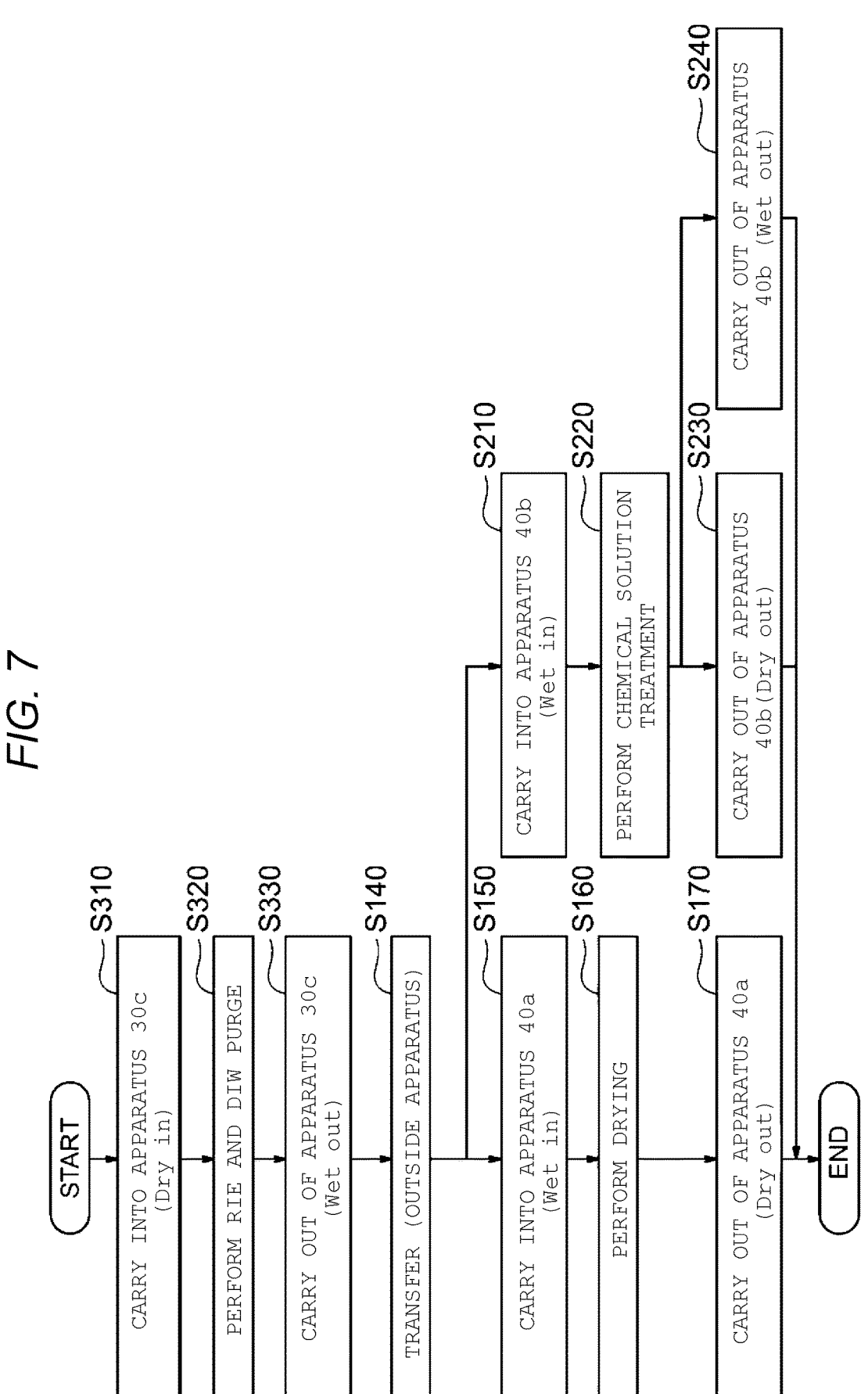
FIG. 7 is a flowchart illustrating an example of a semiconductor device manufacturing method according to a second modification of the first embodiment.

FIG. 7 is a flowchart illustrating an example of a semiconductor device manufacturing method according to a second modification of the first embodiment. The second modification of the first embodiment differs from the first modification of the first embodiment in that no liquid is used in the apparatus (process) prior to the transfer out of the apparatus (step S140).

In steps S310 to S330 illustrated in FIG. 7, an apparatus 30c is provided instead of the apparatus 30a or the apparatus 30b.

The apparatus 30c performs reactive ion etching (RIE) on the wafer W. It is noted that the apparatus 30c performs processing in which no liquid is used without being limited to the RIE. After the RIE, the apparatus 30c places the wafer W in the wafer transfer carrier 10 and supplies pure water into the wafer transfer carrier 10.

First, the transfer unit 20 carries the wafer transfer carrier 10a accommodating the wafer W into the apparatus 30a (S310). The wafer W is transferred by the wafer transfer carrier 10a that does not contain the liquid L therein. Therefore, the wafer W is carried into the apparatus 30c in a dry state.

Next, the apparatus 30c performs RIE, places the wafer W in the wafer transfer carrier 10, and performs DIW purge (S320).

Next, the transfer unit 20 carries the wafer transfer carrier 10 out of the apparatus 30c (S330).

Subsequently, processes identical to those starting from step S140 illustrated in FIG. 6 are performed.

In the second modification of the first embodiment, the wafer W is carried out in a state of being immersed in the pure water even after processing in which no liquid is used, such as RIE. In addition, for example, residual gas from RIE that remains in the wafer W is dissolved in the pure water. As a result, it is possible to prevent the residual gas from affecting the subsequent processing apparatus. For example, it is possible to prevent wet etching apparatus corrosion attributable to the residual gas.

No liquid may be used in the apparatus (process) prior to the transfer out of the apparatus as in the second modification of the first embodiment. The wafer transfer carrier 10 and the semiconductor device manufacturing method according to the second modification of the first embodiment can be identical in effect to the first modification of the first embodiment.

Second Embodiment

FIGS. 8A to 8E are cross-sectional views illustrating an example of a liquid supply-drainage sequence according to a second embodiment. It is noted that FIGS. 8A to 8E illustrate examples when the apparatus 30 supplies the liquid L into the wafer transfer carrier 10 and the apparatus 40 discharges the liquid L out of the wafer transfer carrier 10.

The apparatus 30 has a supply pipe 31, a drain pipe 32, and a liquid level sensor 33.

The supply pipe 31 supplies the liquid L into the container 11.

The drain pipe 32 discharges the liquid L out of the container 11.

The liquid level sensor 33 is provided at the supply pipe 31 and measures a height of a liquid level of the liquid L.

The apparatus 40 has a drain pipe 41 and a liquid level sensor 42.

The drain pipe 41 discharges the liquid L out of the container 11.

The liquid level sensor 42 is provided at the drain pipe 41 and measures the height of the liquid level of the liquid L.

Figure 8A:
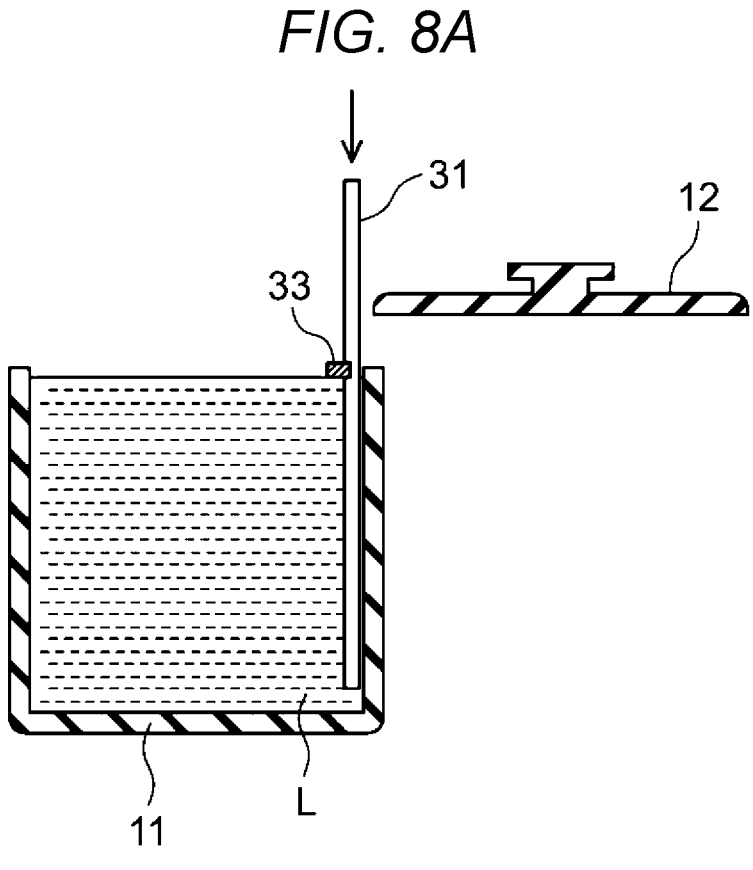
FIG. 8A is a cross-sectional view illustrating an example of a liquid supply-drainage sequence according to a second embodiment.

First, as illustrated in FIG. 8A, the apparatus 30 supplies the liquid L into the container 11 through the supply pipe 31. The apparatus 30 supplies the liquid L until the liquid level of the liquid L reaches a height of the liquid level sensor 33.

Figure 8B:
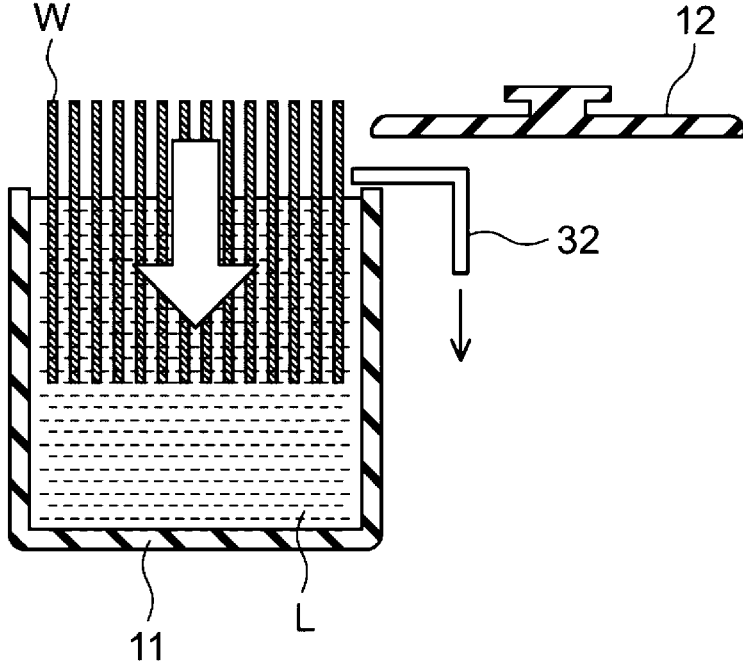
FIG. 8B is a cross-sectional view illustrating an example of the liquid supply-drainage sequence continued from FIG. 8A.

Next, as illustrated in FIG. 8B, the apparatus 30 puts the wafer W into the container 11. The apparatus 30 discharges the liquid L that overflows through the drain pipe 32.

Figure 8C:
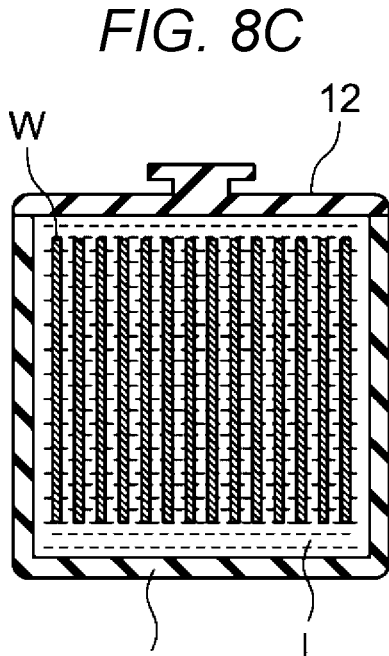
FIG. 8C is a cross-sectional view illustrating an example of the liquid supply-drainage sequence continued from FIG. 8B.

Next, as illustrated in FIG. 8C, the apparatus 30 attaches the lid portion 12.

Figure 8D:
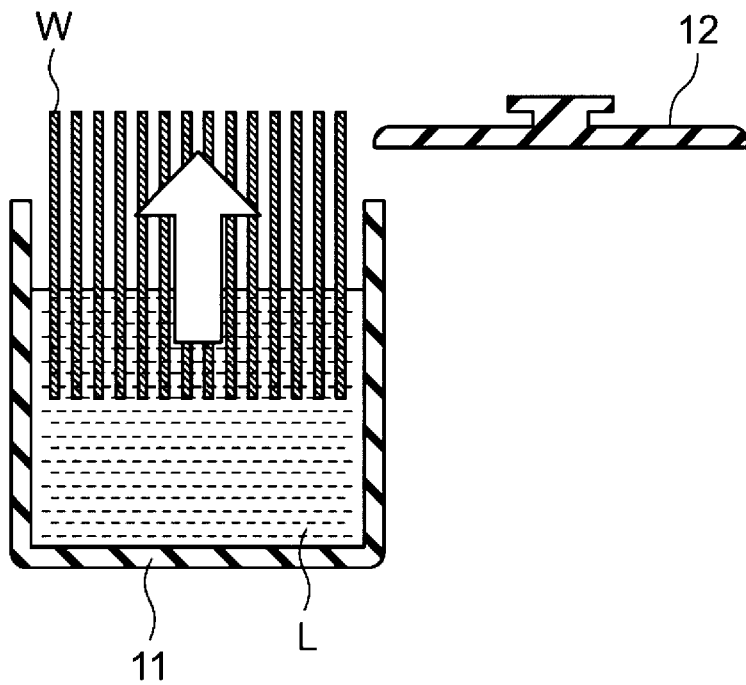
FIG. 8D is a cross-sectional view illustrating an example of the liquid supply-drainage sequence continued from FIG. 8C.

Next, as illustrated in FIG. 8D, the apparatus 40 detaches the lid portion 12 and takes the wafer W out of the container 11.

Figure 8E:
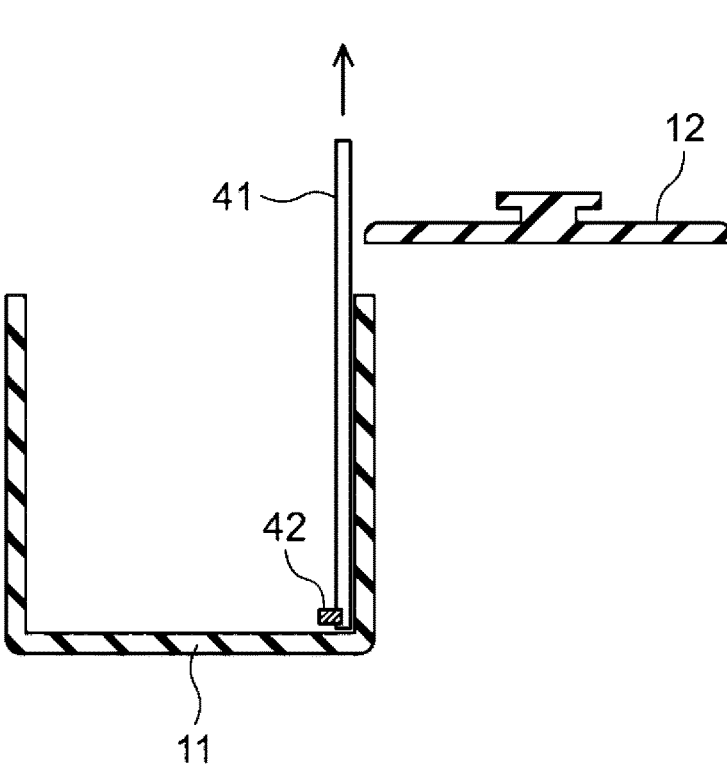
FIG. 8E is a cross-sectional view illustrating an example of the liquid supply-drainage sequence continued from FIG. 8D.

Next, as illustrated in FIG. 8E, the apparatus 40 discharges the liquid L out of the container 11 through the drain pipe 41. The apparatus 40 discharges the liquid L until the liquid level of the liquid L reaches a height of the liquid level sensor 42.

In the second embodiment, the liquid L is supplied into the container 11 before the wafer W is put in. In this case, the time during which the wafer W is immersed in the liquid L can be increased.

It is noted that the wafer W may be put in and taken out sheet by sheet or batch by batch. In the case of sheet-type processing, one wafer W at a time is put into and taken out of the container 11. In the case of batch-type processing, a plurality of the wafers W are collectively put into and taken out of the container 11. It is noted that the apparatuses 30 and 40 may put the wafer W into the container 11 batch by batch and take the wafer W out of the container 11 sheet by sheet. In addition, the apparatuses 30 and 40 may put the wafer W into the container 11 sheet by sheet and take the wafer W out of the container 11 batch by batch.

In addition, the amount of supply of the liquid L in FIG. 8A may be adjusted such that the liquid L does not overflow in FIG. 8B. As a result, waste of the liquid L can be prevented and the drain pipe 32 may be omitted.

The wafer transfer carrier 10 and the semiconductor device manufacturing method according to the second embodiment can be identical in effect to the first embodiment.

First Modification of Second Embodiment

FIGS. 9A to 9E are cross-sectional views illustrating an example of a liquid supply-drainage sequence according to a first modification of the second embodiment. The first modification of the second embodiment differs from the second embodiment in the order of putting in and taking out the wafer W and supplying and discharging the liquid L.

Figure 9A:
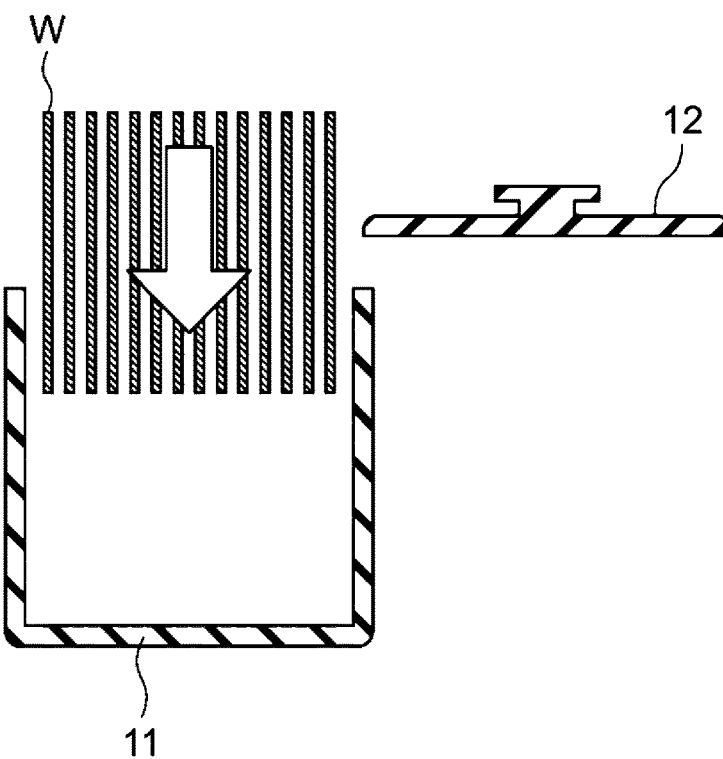
FIG. 9A is a cross-sectional view illustrating an example of a liquid supply-drainage sequence according to a first modification of the second embodiment.

First, as illustrated in FIG. 9A, the apparatus 30 puts the wafer W into the container 11.

Figure 9B:
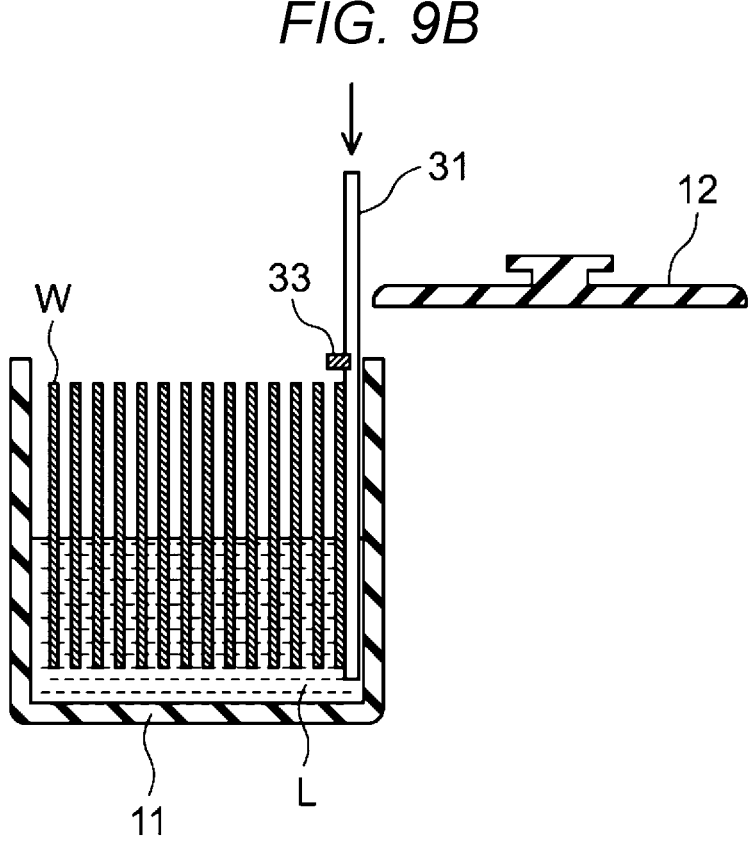
FIG. 9B is a cross-sectional view illustrating an example of the liquid supply-drainage sequence continued from FIG. 9A.

Next, as illustrated in FIG. 9B, the apparatus 30 supplies the liquid L into the container 11 through the supply pipe 31. The apparatus 30 supplies the liquid L until a liquid level of the liquid L reaches the height of the liquid level sensor 33.

Figure 9C:
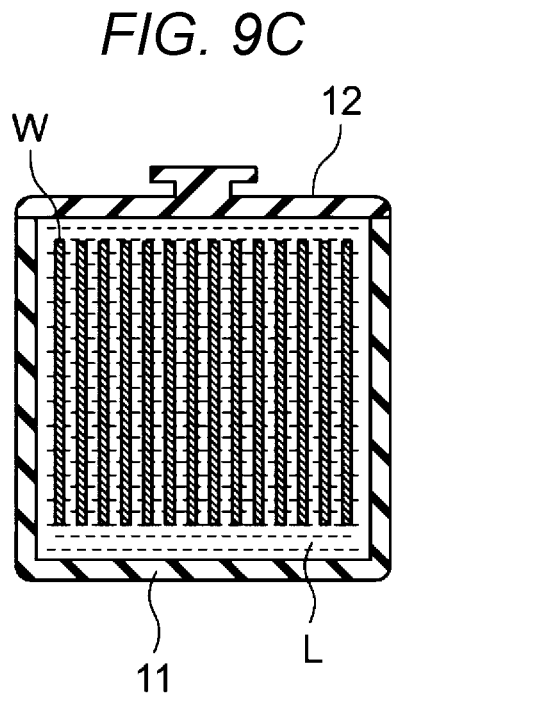
FIG. 9C is a cross-sectional view illustrating an example of the liquid supply-drainage sequence continued from FIG. 9B.

Next, as illustrated in FIG. 9C, the apparatus 30 attaches the lid portion 12.

Figure 9D:
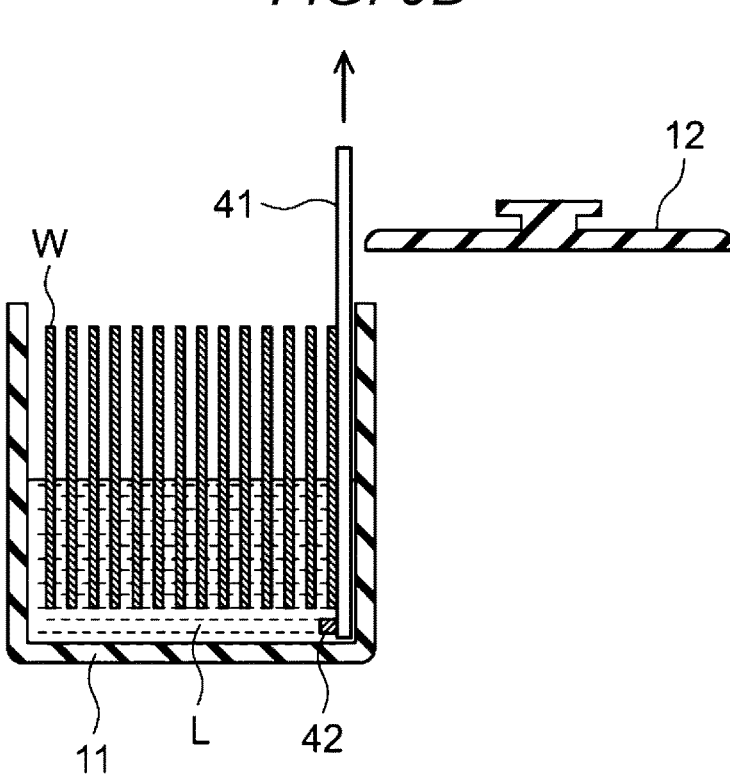
FIG. 9D is a cross-sectional view illustrating an example of the liquid supply-drainage sequence continued from FIG. 9C.

Next, as illustrated in FIG. 9D, the apparatus 40 detaches the lid portion 12 and discharges the liquid L out of the container 11 through the drain pipe 41. The apparatus 40 discharges the liquid L until the liquid level of the liquid L reaches the height of the liquid level sensor 42.

Figure 9E:
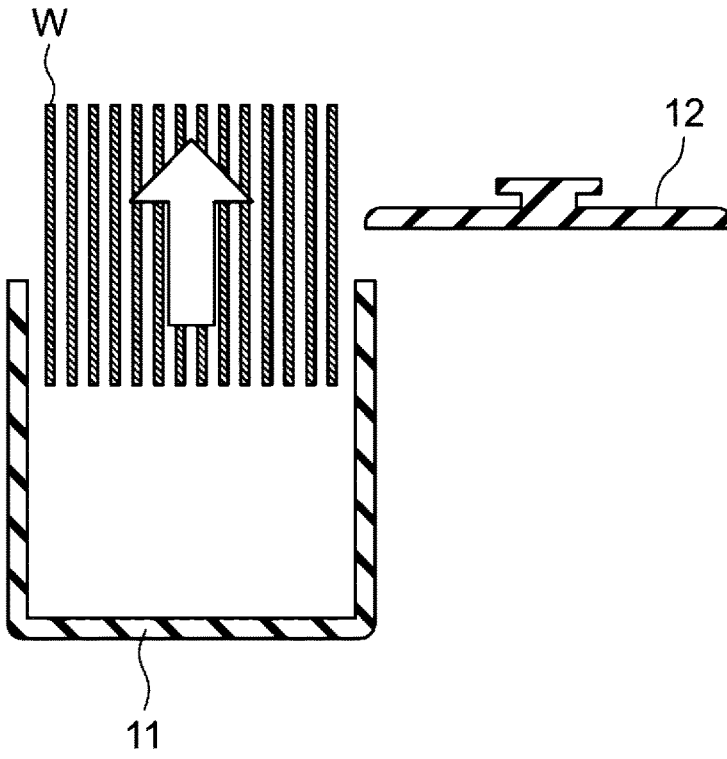
FIG. 9E is a cross-sectional view illustrating an example of the liquid supply-drainage sequence continued from FIG. 9D.

Next, as illustrated in FIG. 9E, the wafer W is taken out of the container 11.

In the first modification of the second embodiment, the liquid L is supplied into the container 11 after the wafer W is put in. In this case, it is possible to prevent the liquid L illustrated in FIG. 8B from overflowing. As a result, waste of the liquid L can be prevented and the drain pipe 32 may be omitted.

The order of putting in and taking out the wafer W and supplying and discharging the liquid L may be changed as in the first modification of the second embodiment. The wafer transfer carrier 10 and the semiconductor device manufacturing method according to the first modification of the second embodiment can be identical in effect to the second embodiment.

Second Modification of Second Embodiment

FIGS. 10A to 10E are cross-sectional views illustrating an example of a liquid supply-drainage sequence according to a second modification of the second embodiment. The second modification differs from the first modification of the second embodiment in how the liquid L is supplied and discharged.

The wafer transfer carrier 10 has a lid portion 12b.

The supply pipe 31 and the drain pipe 41 are capable of penetrating the lid portion 12b. The lid portion 12b has, for example, an openable through via hole. In other words, the supply pipe 31 is capable of supplying the liquid L and the drain pipe 41 is capable of discharging the liquid L with the lid portion 12b attached.

Figure 10A:
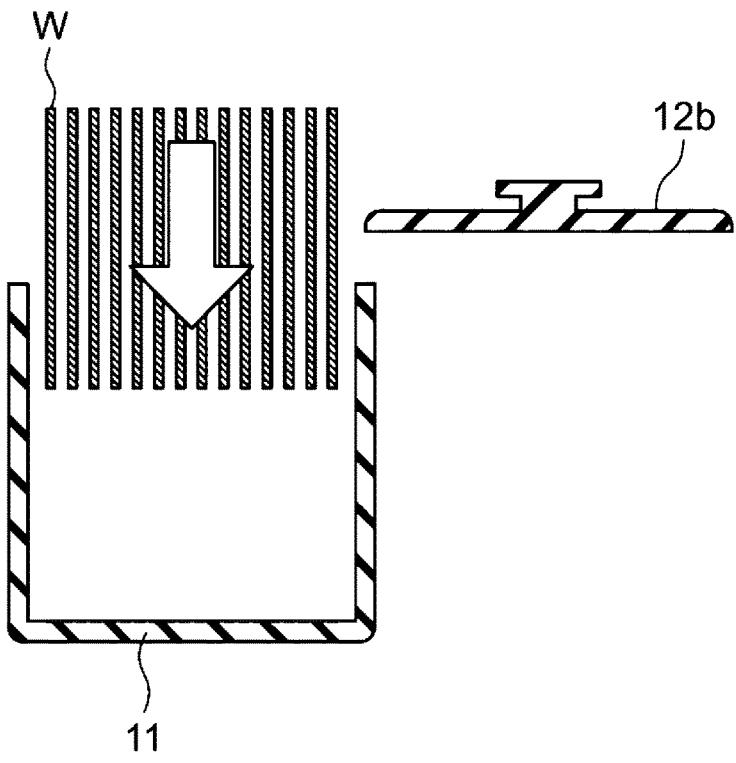
FIG. 10A is a cross-sectional view illustrating an example of a liquid supply-drainage sequence according to a second modification of the second embodiment.

First, as illustrated in FIG. 10A, the apparatus 30 puts the wafer W into the container 11.

Figure 10B:
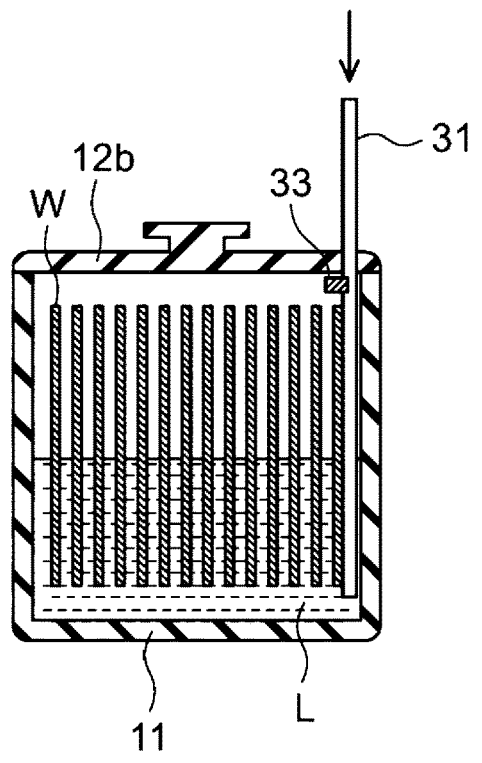
FIG. 10B is a cross-sectional view illustrating an example of the liquid supply-drainage sequence continued from FIG. 10A.

Next, as illustrated in FIG. 10B, the apparatus 30 attaches the lid portion 12b and puts the supply pipe 31 into the container 11 so as to penetrate the lid portion 12b. Subsequently, the apparatus 30 supplies the liquid L into the container 11 through the supply pipe 31. The apparatus 30 supplies the liquid L until a liquid level of the liquid L reaches the height of the liquid level sensor 33.

Figure 10C:
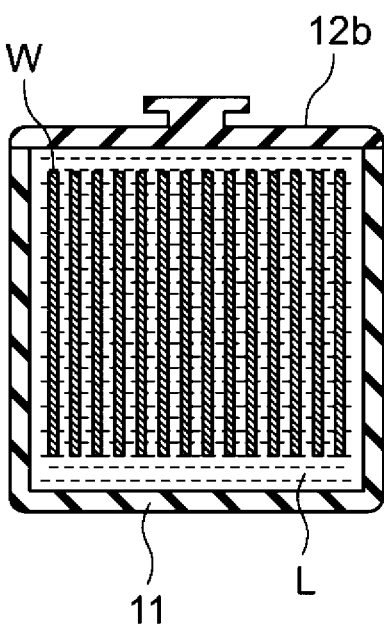
FIG. 10C is a cross-sectional view illustrating an example of the liquid supply-drainage sequence continued from FIG. 10B.

Next, as illustrated in FIG. 10C, the apparatus 30 takes out the supply pipe 31.

Figure 10D:
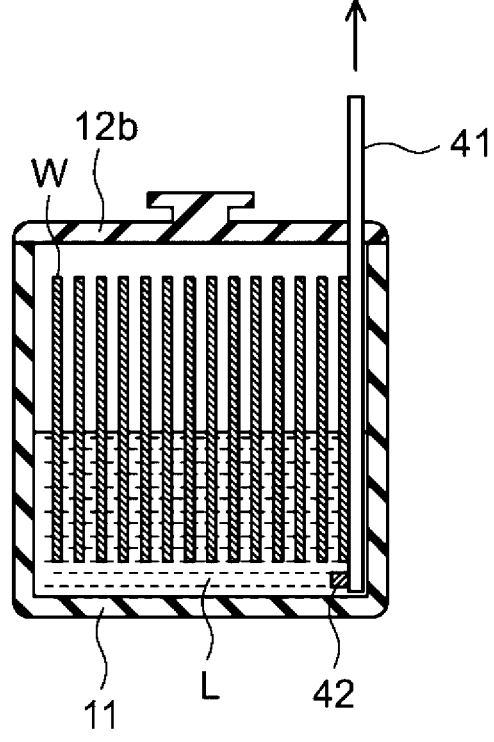
FIG. 10D is a cross-sectional view illustrating an example of the liquid supply-drainage sequence continued from FIG. 10C.

Next, as illustrated in FIG. 10D, the apparatus 40 puts the drain pipe 41 into the container 11 so as to penetrate the lid portion 12b. Subsequently, the apparatus 40 discharges the liquid L out of the container 11 through the drain pipe 41. The apparatus 40 discharges the liquid L until the liquid level of the liquid L reaches the height of the liquid level sensor 42.

Figure 10E:
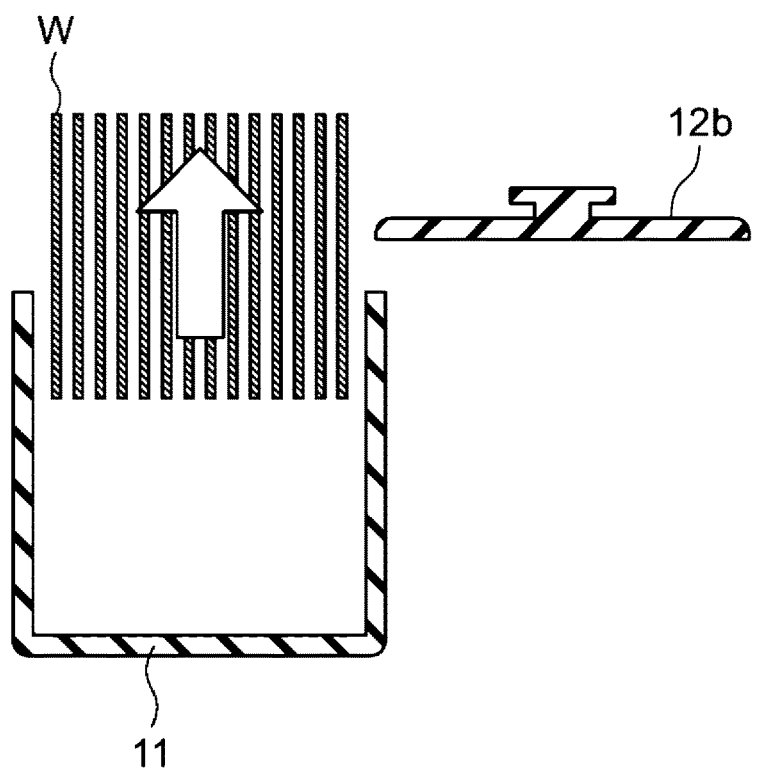
FIG. 10E is a cross-sectional view illustrating an example of the liquid supply-drainage sequence continued from FIG. 10D.

Next, as illustrated in FIG. 10E, the apparatus 40 detaches the lid portion 12b and takes out the wafer W.

How the liquid L is supplied and discharged may be changed as in the second modification of the second embodiment. The wafer transfer carrier 10 and the semiconductor device manufacturing method according to the second modification of the second embodiment can be identical in effect to the first modification of the second embodiment.

Third Embodiment

Figure 11:
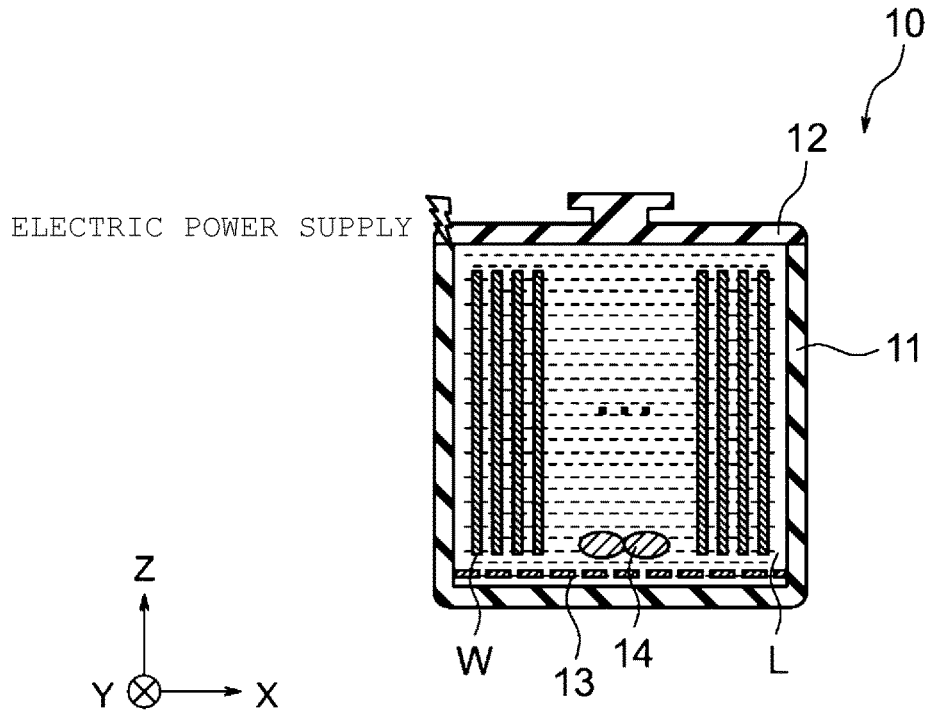
FIG. 11 is a cross-sectional view illustrating an example of a configuration of a wafer transfer carrier according to a third embodiment.

FIG. 11 is a cross-sectional view illustrating an example of a configuration of the wafer transfer carrier 10 according to a third embodiment. The third embodiment differs in the configuration of the wafer transfer carrier 10. It is noted that, in the third embodiment, the liquid L is, for example, a chemical solution for wet etching.

The wafer transfer carrier 10 further has a temperature control unit (temperature controller) 13 and a stirrer 14.

The temperature control unit 13 controls a temperature of the liquid L accommodated in the container 11. The temperature control unit 13 has, for example, a temperature sensor and a heater. The temperature control unit 13 keeps the temperature of the liquid L in the container 11 at, for example, a predetermined temperature.

The stirrer (stirring unit) 14 stirs the liquid L accommodated in the container 11. As a result, stagnation of the chemical solution can be prevented.

In addition, the wafer transfer carrier 10 further has a power receiving unit (power receiver). In other words, the wafer transfer carrier 10 is supplied with electric power from the outside. As a result, the internal configurations of the wafer transfer carrier 10, such as the temperature control unit 13 and the stirrer 14, can be driven. The power receiving unit is supplied with electric power from the transfer unit 20 while, for example, the wafer transfer carrier 10 is transferred. Alternatively, the power receiving unit is supplied with electric power while the wafer transfer carrier 10 is placed in the placement portion 50.

By the temperature control unit 13 and the stirrer 14, a normal chemical solution treatment apparatus can be reproduced in the wafer transfer carrier 10. In other words, the inside of the wafer transfer carrier 10 can be brought closer to a chemical solution treatment apparatus. As a result, chemical solution treatment can be more appropriately performed in the wafer transfer carrier 10.

The configuration of the wafer transfer carrier 10 may be changed as in the third embodiment. The wafer transfer carrier 10 and the semiconductor device manufacturing method according to the third embodiment can be identical in effect to the first embodiment.

Fourth Embodiment

FIG. 12 is a cross-sectional view illustrating an example of a configuration of the wafer transfer carrier 10 according to a fourth embodiment. The fourth embodiment differs in the configuration of the wafer transfer carrier 10. It is noted that, in the fourth embodiment, the liquid L is, for example, a chemical solution for wet etching.

The wafer transfer carrier 10 further has circulation piping 15, a pump 16, a temperature control unit (temperature controller) 17, and a filter 18.

The circulation piping (circulation path) 15 is connected to two different positions in the container 11. In the example illustrated in FIG. 12, one end of the circulation piping 15 is connected to the lower portion of an inner wall of the container 11, and the other end of the circulation piping 15 is connected to the upper portion of the inner wall of the container 11.

The pump 16 is provided on a path of the circulation piping 15. The pump 16 suctions the liquid L from the one end of the circulation piping 15 and circulates the liquid L to the other end of the circulation piping 15. In other words, the pump 16 sends the liquid L from one position in the container 11 where the circulation piping 15 is connected to the other position.

The temperature control unit 17 controls a temperature of the liquid L. The temperature control unit 17 has, for example, a temperature sensor and a heater. The temperature control unit 17 is provided on the path of the circulation piping 15. In other words, the temperature control unit 17 controls the temperature of the circulating liquid L. The temperature control unit 17 keeps the temperature of the liquid L in the container 11 at, for example, a predetermined temperature.

The filter 18 is provided on the path of the circulation piping 15. The filter 18 filters the circulating liquid L. As a result, particles, residual elements, and the like can be captured.

By the circulation piping 15, the pump 16, the temperature control unit 17, and the filter 18, a normal chemical solution treatment apparatus can be reproduced in the wafer transfer carrier 10. In other words, the inside of the wafer transfer carrier 10 can be brought closer to a chemical solution treatment apparatus. As a result, chemical solution treatment can be more appropriately performed in the wafer transfer carrier 10.

The configuration of the wafer transfer carrier 10 may be changed as in the fourth embodiment. The wafer transfer carrier 10 and the semiconductor device manufacturing method according to the fourth embodiment can be identical in effect to the first embodiment.

Fifth Embodiment

FIG. 13 is a cross-sectional view illustrating an example of a configuration of the wafer transfer carrier 10 according to a fifth embodiment.

The transfer unit 20 has a grip portion 21 gripping the wafer transfer carrier 10.

The wafer transfer carrier 10 further includes a protrusion portion 19a.

The protrusion portion 19a is provided on the lid portion 12. The wafer transfer carrier 10 can be transferred by the grip portion 21 gripping the protrusion portion 19a.

The wafer transfer carrier 10 and the semiconductor device manufacturing method according to the fifth embodiment can be identical in effect to the first embodiment.

Sixth Embodiment

Figure 14:
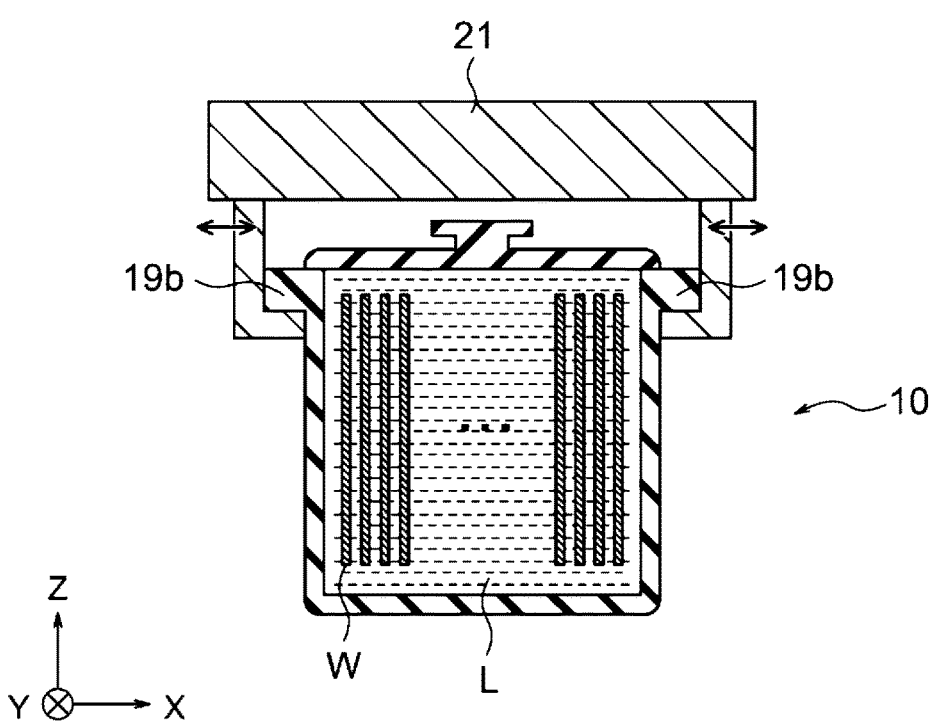
FIG. 14 is a cross-sectional view illustrating an example of a configuration of a wafer transfer carrier according to a sixth embodiment.

FIG. 14 is a cross-sectional view illustrating an example of a configuration of the wafer transfer carrier 10 according to a sixth embodiment. The sixth embodiment differs from the fifth embodiment in the configuration of the wafer transfer carrier 10.

The wafer transfer carrier 10 further includes a protrusion portion 19b.

The protrusion portion 19b is provided on the container 11. The protrusion portion 19b comes into contact with the grip portion 21 when the wafer transfer carrier 10 is transferred. The wafer transfer carrier 10 can be transferred by the grip portion 21 gripping the protrusion portion 19b. In the example illustrated in FIG. 14, the grip portion 21 supports the protrusion portion 19b from below.

In the fifth embodiment described with reference to FIG. 13, the protrusion portion 19a is provided on the lid portion 12. In this case, force is applied to the lid portion 12 during the transfer. When the strength of the lid portion 12 is insufficient, it may be impossible to appropriately transfer the wafer transfer carrier 10.

On the other hand, in the sixth embodiment, the container 11 is provided with the protrusion portion 19*b* gripped by the transfer unit 20. As a result, the wafer transfer carrier 10 can be transferred more appropriately.

The configuration of the wafer transfer carrier 10 may be changed as in the sixth embodiment. The wafer transfer carrier 10 and the semiconductor device manufacturing method according to the sixth embodiment can be identical in effect to the fifth embodiment.

Seventh Embodiment

Figure 15:
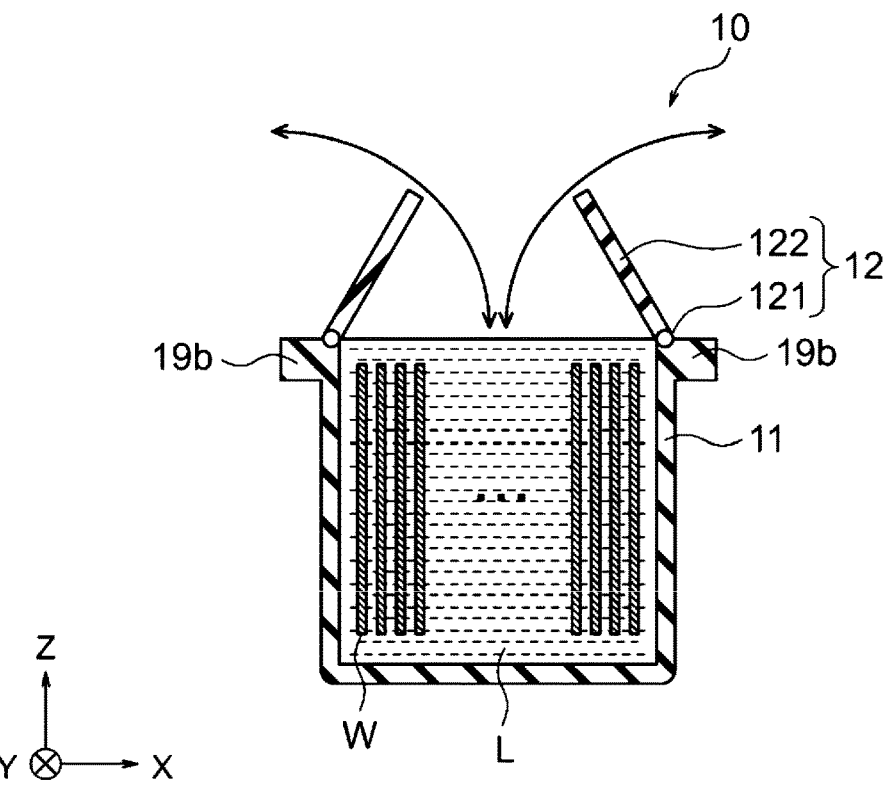
FIG. 15 is a cross-sectional view illustrating an example of a configuration of a wafer transfer carrier according to a seventh embodiment.

FIG. 15 is a cross-sectional view illustrating an example of a configuration of the wafer transfer carrier 10 according to a seventh embodiment. The seventh embodiment differs in the configuration of the wafer transfer carrier 10.

The lid portion 12 has shafts 121 and plate-shaped members 122.

The shaft 121 is provided along an edge of the container 11. In the example illustrated in FIG. 15, the shaft 121 is parallel to the Y direction.

The plate-shaped member 122 opens and closes the container 11 by rotating about the shaft 121 provided along the edge of the container 11. In other words, the lid portion 12 is a double door-type lid portion. As a result, a space for placing the detached lid portion 12 is unnecessary and space can be saved.

In addition, two shafts 121 and two plate-shaped members 122 are provided in the example illustrated in FIG. 15. The two plate-shaped members 122 rotate in directions opposite to each other.

In the example illustrated in FIG. 15, the container 11 is provided with the protrusion portion 19*b* in the sixth embodiment described with reference to FIG. 14.

The configuration of the wafer transfer carrier 10 may be changed as in the seventh embodiment. The wafer transfer carrier 10 and the semiconductor device manufacturing method according to the seventh embodiment can be identical in effect to the first embodiment.

Eighth Embodiment

FIG. 16 is a cross-sectional view illustrating an example of a configuration of the wafer transfer carrier 10 according to an eighth embodiment. The eighth embodiment differs in the configuration of the wafer transfer carrier 10.

A size of the wafer transfer carrier 10 in the X direction is smaller in the example illustrated in FIG. 16 than in the first embodiment described with reference to FIG. 2. A pitch between the wafers W is, for example, 5 mm. The size of the wafer transfer carrier 10 can be reduced by reducing the pitch between the wafers W. As a result, space can be saved. In addition, an amount of the liquid L in the container 11 can be reduced. As a result, weight reduction is possible and the amount of the liquid L that is required can be reduced.

The configuration of the wafer transfer carrier 10 may be changed as in the eighth embodiment. The wafer transfer carrier 10 and the semiconductor device manufacturing method according to the eighth embodiment can be identical in effect to the first embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A wafer transfer carrier comprising:
   a container configured to store a wafer and a liquid; and
   a lid portion capable of sealing an inside of the container,
   wherein the container is capable of being moved in a state where the wafer is in contact with the liquid.

2. The wafer transfer carrier according to claim 1, further comprising a first temperature controller configured to control a temperature of the liquid in the container.

3. The wafer transfer carrier according to claim 2, further comprising a power receiver configured to receive electric power during at least one of movement or stop of the wafer.

4. The wafer transfer carrier according to claim 1, further comprising a stirrer configured to stir the liquid in the container.

5. The wafer transfer carrier according to claim 1, further comprising:
   a circulation path connected to two different positions in the container;
   a pump disposed on a path of the circulation path, the pump configured to send the liquid from one position in the container where the circulation path is connected to an other position; and
   a filter disposed on the path of the circulation path.

6. The wafer transfer carrier according to claim 1, further comprising:
   a circulation path connected to two different positions in the container;
   a pump disposed on a path of the circulation path, the pump configured to send the liquid from one position in the container where the circulation path is connected to an other position; and
   a second temperature controller disposed on the path of the circulation path, and configured to control a temperature of the circulating liquid.

7. The wafer transfer carrier according to claim 1, wherein (i) a supply portion configured to supply the liquid into the container and a (ii) drain portion configured to discharge the liquid out of the container, penetrate the lid portion.

8. The wafer transfer carrier according to claim 1, wherein the lid portion is disposed on the container.

9. The wafer transfer carrier according to claim 1, wherein the container stores the wafer such that a surface of the wafer is placed vertically.

10. The wafer transfer carrier according to claim 1, wherein the container and the lid portion have fluorine-coated inner surfaces.

11. The wafer transfer carrier according to claim 10, wherein the fluorine-coated inner surfaces include a fluorine resin.

12. The wafer transfer carrier according to claim 1, further comprising a protrusion disposed on the container, the protrusion portion coming into contact with a grip portion gripping the wafer transfer carrier when the wafer transfer carrier is transferred.

13. The wafer transfer carrier according to claim 1, wherein the lid portion has a plate-shaped member opening and closing the container by rotating about a shaft provided along an edge of the container.

14. The wafer transfer carrier according to claim 1, wherein the liquid is a chemical solution.

15. The wafer transfer carrier according to claim 1, wherein the liquid is pure water.

16. The wafer transfer carrier according to claim 1, further comprising a liquid level sensor configured to sense the liquid.

17. A semiconductor device manufacturing method comprising:

supplying, using a first supply apparatus, a chemical solution into a container;

moving the container from the first supply apparatus in a state where a wafer in the container is in contact with the chemical solution; and processing the wafer with the chemical solution outside the first supply apparatus.

18. The semiconductor device manufacturing method according to claim 17, further comprising:

moving the container to a second apparatus; and supplying, using the second apparatus, the rinse liquid into the container.

19. A semiconductor device manufacturing method comprising: supplying pure water into a container using a supply apparatus supplying the pure water; and moving the container from the supply apparatus in a state where a wafer in the container is in contact with the pure water.

20. The semiconductor device manufacturing method according to claim 19, further comprising maintaining the state where the wafer is in contact with the pure water until a next process is performed.

* * * * *